US007498895B2

(12) United States Patent
Hashimoto et al.

(10) Patent No.: US 7,498,895 B2
(45) Date of Patent: Mar. 3, 2009

(54) NOISE FILTER, OUTDOOR UNIT AND AIR CONDITIONER

(75) Inventors: Masafumi Hashimoto, Sakai (JP); Sumio Kagimura, Sakai (JP); Hiroshi Dohmae, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 952 days.

(21) Appl. No.: 10/500,024

(22) PCT Filed: Jan. 8, 2003

(86) PCT No.: PCT/JP03/00056

§ 371 (c)(1),
(2), (4) Date: Jun. 25, 2004

(87) PCT Pub. No.: WO03/058651

PCT Pub. Date: Jul. 17, 2003

(65) Prior Publication Data

US 2005/0093651 A1 May 5, 2005

(30) Foreign Application Priority Data

Jan. 8, 2002 (JP) ............................ 2002-001334

(51) Int. Cl.
*H04B 3/28* (2006.01)
*H03H 7/03* (2006.01)
*H01F 30/00* (2006.01)

(52) U.S. Cl. ......................... 333/12; 333/181; 62/228.4

(58) Field of Classification Search ................... 333/12, 333/24 R, 181; 62/228.4, 230
See application file for complete search history.

(56) References Cited

U.S. PATENT DOCUMENTS

| | | | | |
|---|---|---|---|---|
| 5,062,278 | A * | 11/1991 | Sugiyama | 62/230 |
| 6,053,002 | A * | 4/2000 | Matsumoto et al. | 62/230 |
| 6,082,122 | A * | 7/2000 | Madenokouji et al. | 62/77 |
| 6,151,228 | A * | 11/2000 | Miyazaki et al. | 363/48 |
| 6,215,386 | B1 | 4/2001 | Gokita et al. | |
| 7,100,382 | B2 * | 9/2006 | Butler et al. | 62/126 |

FOREIGN PATENT DOCUMENTS

| | | | |
|---|---|---|---|
| JP | 55-68328 | U | 5/1980 |
| JP | 60-74412 | A | 4/1985 |
| JP | 60-258910 | A | 12/1985 |
| JP | 61-162737 | U | 10/1986 |
| JP | 06-313609 | A | 11/1994 |
| JP | 7-243691 | A | 9/1995 |
| JP | 11-186055 | A | 7/1999 |
| JP | 11-186073 | A | 7/1999 |
| JP | 11-211291 | A | 8/1999 |
| JP | 11-329851 | A | 11/1999 |

* cited by examiner

*Primary Examiner*—Dean O Takaoka
(74) *Attorney, Agent, or Firm*—Global IP Counselors

(57) ABSTRACT

A noise filter eliminates noise generated by a noise generating source in an outdoor unit in an air conditioner. Power is supplied from a power source to an indoor unit via the outdoor unit. A choke coil is formed by winding power source lines and indoor/outdoor lines inter unit lines around a common magnetic body. The number of turns of the power source lines and that of the indoor/outdoor lines are preferably set so as to be almost proportional to their impedances. Due to this arrangement, noises of the lines can be cancelled while maintaining balance of influences on the magnetic field of the choke coil.

16 Claims, 3 Drawing Sheets

PRIOR ART

NOISE FILTER, OUTDOOR UNIT AND AIR CONDITIONER

TECHNICAL FIELD

The present invention relates to a noise filter, an outdoor unit and an air conditioner and, more particularly, to a noise filter for eliminating noise generated from a predetermined noise generating source in a first unit in an electric device in which power is supplied from an original power source to a second unit via the first unit, an outdoor unit and an air conditioner.

BACKGROUND ART

FIG. 4 is a block diagram showing an example of a conventional air conditioner 1. In the air conditioner 1 of this type, power is supplied from an original power source 2 on the outside to an outdoor unit 3 and, in addition, the power is branched in the outdoor unit 3 and supplied also to an indoor unit 4.

In this case, the power supply from the original power source 2 to the outdoor unit 3 and the power supply branched from the outdoor unit 3 to the indoor unit 4 are performed via respectively separated power source lines 5*a*, 5*b*, 6*a* and 6*b*.

Reference numeral 7 denotes a signal line and, a bundle of electric lines obtained by bundling the signal line 7 and the power source lines 6*a* and 6*b* is called indoor/outdoor lines Lin. Reference numeral 9 indicates a noise generating source such as an inverter or the like in the outdoor unit 3 and reference numerals 10 and 11 denote a transmission circuit and a reception circuit in the outdoor unit 3. The transmission circuit 10 and the reception circuit 11 are connected to the power source lines 5*a* and 5*b* via power source lines 8*a* and 8*b* and, while receiving the supply of power, transmit/receive signals to/from the indoor unit 4 via the signal line 7. The power source lines 8*a* and 8*b* for supplying the power to the transmission circuit 10 and reception circuit 11 are branched and connected to the power source lines 6*a* and 6*b* of the indoor/outdoor lines Lin and supply power also to the indoor unit 4.

In the air conditioner 1, the noise generating source 9 exists as described above. Generally, it is requested to design the voltage level of each of noise 12 which is superposed in the power source lines 5*a* and 5*b* and noise 13 which is superposed in the power source lines 6*a* and 6*b* so as to be within a predetermined specification.

Conventionally, a first noise filter 15 is provided for the power source lines 5*a* and 5*b* extending between electrical parts in the outdoor unit 3 such as the noise generating source 9, transmission circuit 10, and reception circuit 11 and the original power source 2 and, a second noise filter 16 different from the first noise filter 15 is provided for the indoor/outdoor lines Lin extending between the electrical parts 9, 10 and 11 and the indoor unit 4.

As described above, when the different noise filters 15 and 16 are provided for the power source lines 5*a* and 5*b* between the original power source 2 and the outdoor unit 3 and for the indoor/outdoor lines Lin between the outdoor unit 3 and the indoor unit 4, a problem occurs such that even when the noise filters 15 and 16 independently try to eliminate the noises 12 and 13, the noise filters 15 and 16 cannot sufficiently eliminate the noises 12 and 13, respectively, due to insufficient properties of the noise filters 15 and 16 and the like.

DISCLOSURE OF THE INVENTION

An object of the present invention is to solve the problem as described above and to provide a noise filter capable of efficiently eliminating noise which generates in an outdoor unit in an air conditioner having a configuration that power is supplied from an original power source to the outdoor unit and the power is branched in the outdoor unit and supplied to an indoor unit, an outdoor unit and an air conditioner.

A first aspect of a noise filter according to the present invention is a noise filter (21) in an electric device for reducing noises (12, 13) from a predetermined noise generating source (9), the electric device comprising a first unit (3) to which power is supplied from an original power source (2) and has the predetermined noise generating source (9), and a second unit (4) to which the power is supplied through a branch in the first unit, wherein power source lines (5*a*, 5*b*) for supplying the power from the original power source to the predetermined noise generating source (9) and inter-unit lines (6*a*, 6*b*, 7) for supplying the power from the branch to the second unit are wound around the same magnetic body.

Since a choke coil is constructed by winding the power source lines and the inter-unit lines around a common magnetic body, noises can be efficiently eliminated by making the noises in the lines cancel out each other.

Desirably, the number of turns of the power source lines and that of the inter-unit lines are set to be different from each other.

Since the number of turns of the power source lines and that of the inter-unit lines are set to be different from each other, the ratio of the number of turns of the inter-unit lines to the number of turns of the power source lines may be set on the basis of (for example, almost proportional to) the ratio of an impedance of the inter-unit lines to an impedance of the power source lines. Thus, influences on the magnetic fields of the lines can be made uniform and noises in the lines can be canceled out. Therefore, at the time of eliminating noises, the noises can be prevented from being excessively or insufficiently canceled out.

In the case where the inter-unit lines are constructed of a plurality of lines, for example, a total impedance of the plurality of lines may be regarded as an impedance of the inter-unit lines, and a bundle of electric lines obtained by bundling the plurality of lines may be wound as the inter-unit lines. Alternately, the ratio of the number of turns of the power source lines and the number of turns of the plurality of lines of the inter-unit lines may be set on the basis of (for example, almost proportional to) the ratio of the impedances. In such a manner, noises can be canceled out in balance.

When the present invention is applied to an air conditioner comprising an outdoor unit in the air conditioner as the first unit and an indoor unit as the second unit, noises which generate in a noise generating source in the outdoor unit and fail to be transmitted to an original power source and an indoor unit can be efficiently eliminated. The present invention is, particularly, effective to the case where an inverter provided for the outdoor unit of the air conditioner is the noise generating source.

The objects, features, aspects and advantages of the present invention will become more apparent from the following detailed description and appended drawings.

BEST MODE FOR CARRYING OUT THE INVENTION

Figure 1:
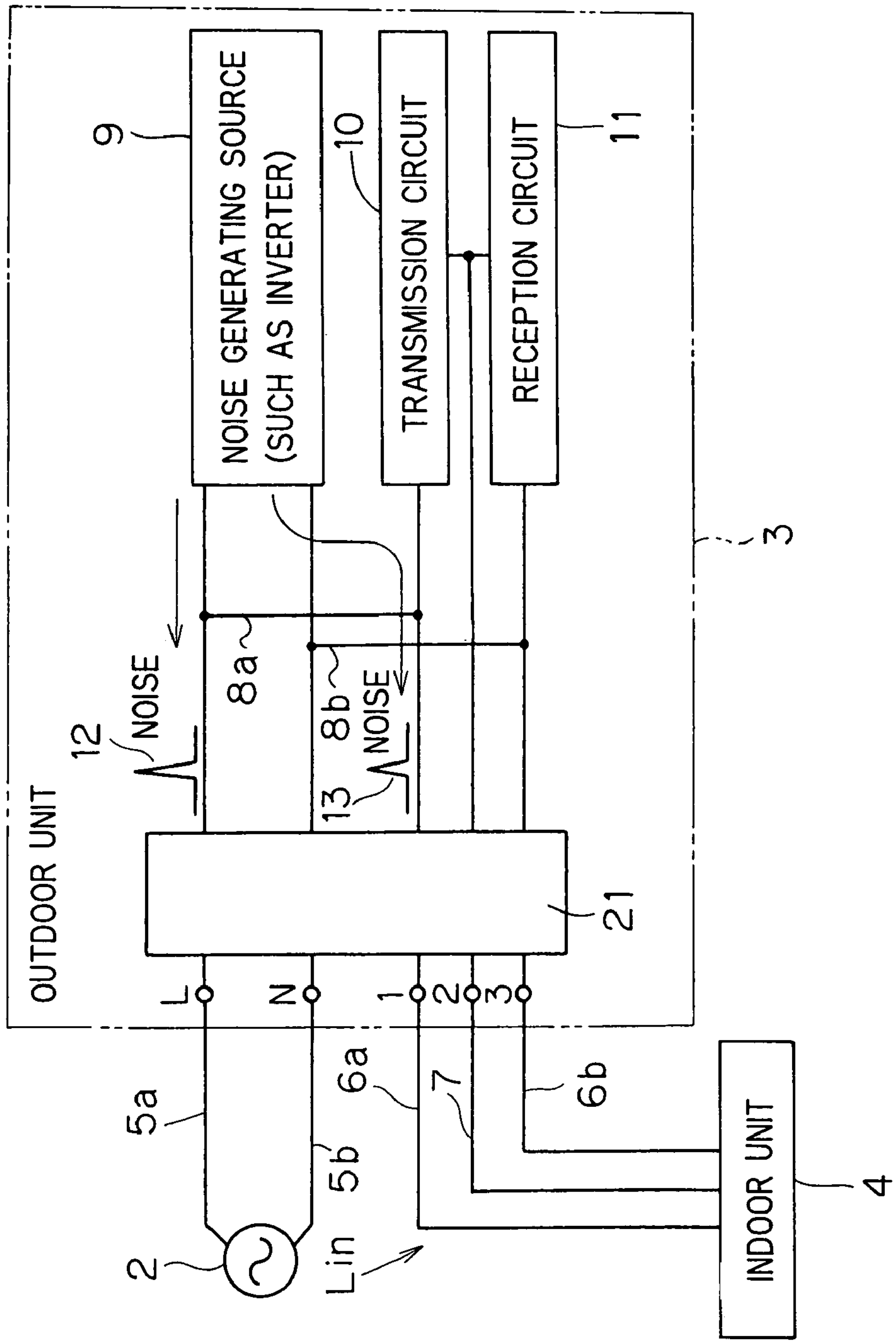
FIG. 1 is a block diagram showing an air conditioner in which a noise filter according to an embodiment of the present invention is installed.

FIG. 1 is a block diagram showing an air conditioner in which a noise filter according to an embodiment of the present invention is assembled. In the embodiment, elements having the same function as that of the conventional elements are given the same reference numerals.

Figure 2:
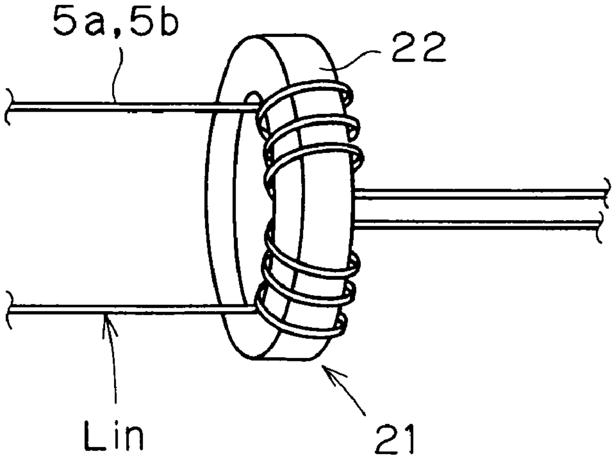
FIG. 2 is a perspective view showing the noise filter according to the embodiment of the present invention.

The air conditioner has, as shown in FIG. 1, a noise eliminating unit (noise filter) 21 commonly provided for the power source lines 5*a* and 5*b* between the original power source 2 and the outdoor unit (first unit) 3 and the indoor/outdoor lines (inter-unit lines) Lin between the outdoor unit 3 and the indoor unit (second unit) 4 (a bundle of electric lines obtained by bundling the power source lines 6*a* and 6*b* and the signal line 7). The noise eliminating unit 21 is formed by, as shown in FIG. 2, winding the power source lines 5*a* and 5*b* together with the power source lines 6*a* and 6*b* and the signal line 7 in the indoor/outdoor lines Lin around a magnetic body 22 such as a single, annular-shaped ferrite core in a common mode to form a choke coil. Since magnetic fluxes are generated in the directions opposite to each other by the noises 12 and 13 which are respectively transmitted in the power source lines 5*a* and 5*b* and in the power source lines 6*a* and 6*b*, the noises 12 and 13 can be efficiently eliminated. Therefore, the influence of the noise on the signal line 7 can be also eliminated.

Concretely, the noise generating source 9 is an inverter. An object to which the noise generating source 9 is connected as to the power source lines 5*a* and 5*b* is the original power source 2, and that as to the power source lines 6*a* and 6*b* is the indoor unit 4, so that the objects are different from each other. As above said, an impedance difference usually occurs between the objects to which the outdoor unit 3 is connected.

In the indoor/outdoor lines Lin, the impedance in the power source lines 6*a* and 6*b* and the impedance in the signal line 7 are different from each other. When the lines 5*a*, 5*b*, 6*a*, 6*b* and 7 having different impedances are wound by the same number of turns, the magnetic field generated in the magnetic body 22 does not become uniform in the lines 5*a*, 5*b*, 6*a*, 6*b* and 7, and the noises 12 and 13 are canceled in off balance. Consequently, the number of turns of each of the lines 5*a*, 5*b*, 6*a*, 6*b* and 7 is set in consideration of the ratio of the impedances so that the influence on the magnetic field generated in the common magnetic body 22 becomes almost uniform.

Figure 3:
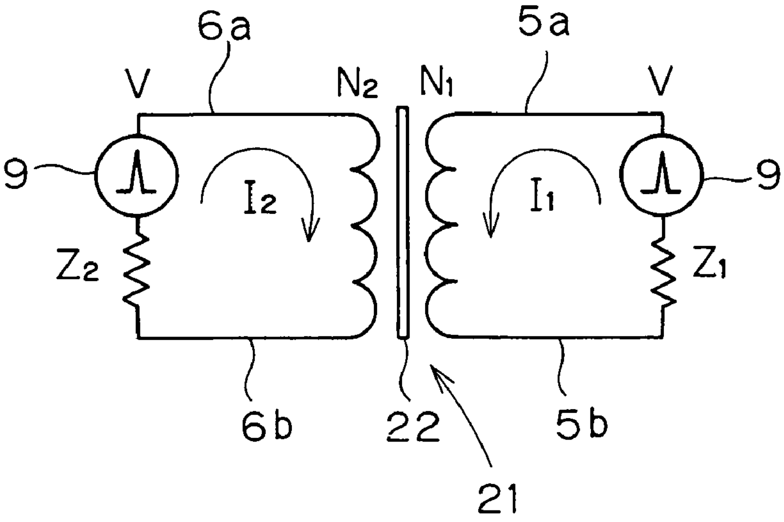
FIG. 3 is an equivalent circuit diagram showing the noise filter according to the embodiment of the present invention.
Figure 4:
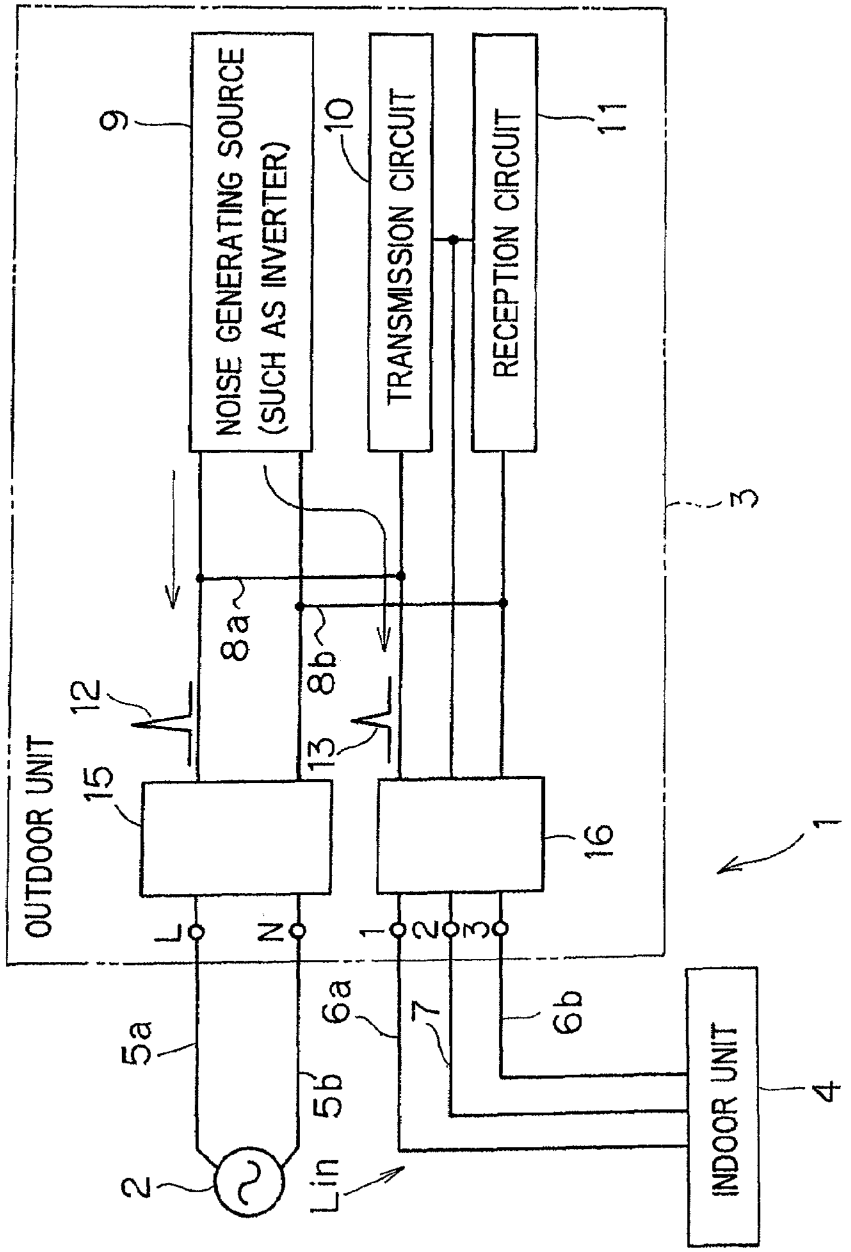
FIG. 4 is a block diagram showing a conventional air conditioner.

Theoretically, since the noises 12 and 13 come from the same noise generating source 9, the larger the impedance of each of the wound lines 5*a*, 5*b*, 6*a*, 6*b* and 7 is, the smaller the magnetic field generated in the magnetic body 22 by the lines 5*a*, 5*b*, 6*a*, 6*b* and 7 becomes. For example, as shown in FIG. 3, when it is assumed that a current flowing between the power source lines 5*a* and 5*b* is I1, a current flowing between the power source lines 6*a* and 6*b* is 12, the total number of turns of the power source lines 5*a* and 5*b* is N1, and the total number of turns of the power source lines 6*a* and 6*b* is N2, if the influence on the magnetic fields of the power source lines 5*a* and 5*b* and the power source lines 6*a* and 6*b* is made uniform, theoretically, the following equation (1) is satisfied.

$$N1 \times I1 = N2 \times I2 \tag{1}$$

When the voltage level of each of the noises 12 and 13 which occur in the power source lines 5*a* and 5*b* and the power source lines 6*a* and 6*b* is V, an impedance between the power source lines 5*a* and 5*b* is Z1, and an impedance between the power source lines 6*a* and 6*b* is Z2, the Ohm's law of the following equations (2) and (3) is satisfied.

$$I1 = V/Z1 \tag{2}$$

$$I2 = V/Z2 \tag{3}$$

From the equations (1) to (3), the following equation (4) can be derived.

$$N1/Z1 = N2/Z2 \tag{4}$$

The relations are applied to all of the lines 5*a*, 5*b*, 6*a*, 6*b* and 7. Therefore, when the number of turns of the lines 5*a*, 5*b*, 6*a*, 6*b* and 7 of a relatively high impedance is set to be proportionally large, in theory, the influence on the magnetic fields of the lines 5*a*, 5*b*, 6*a*, 6*b* and 7 can be made uniform and the noises 12 and 13 can be properly canceled out. Concretely, the impedance of the lines 6*a*, 6*b* and 7 of the indoor/outdoor lines Lin connected to the indoor unit 4 is higher than that of the power source lines 5*a* and 5*b* connected to the original power source 2. Therefore, the number of turns of each of the lines 6*a*, 6*b* and 7 of the indoor/outdoor lines Lin is set to be larger than that of the power source lines 5*a* and 5*b* connected to the original power source 2. In practice, however, there is a case such that the degree of noise elimination varies due to a factor other than the above-described theory, such as resonance of noise by an influence of other peripheral parts or the like. Consequently, it is desirable to set the number of turns of each of the lines 5*a*, 5*b*, 6*a*, 6*b* and 7 on the basis of actual measurement values of the degree of noise elimination while making the influences on the magnetic field of the lines 5*a*, 5*b*, 6*a*, 6*b* and 7 uniform by using the relation of the equation 4 as a foundation. In this case as well, the impedances and the number of turns of the lines 5*a*, 5*b*, 6*a*, 6*b* and 7 are set so as to be almost proportional to each other.

In such a manner, when the noises 12 and 13 are transmitted from the noise generating source 9 to the lines 5*a*, 5*b*, 6*a*, 6*b* and 7, the lines 5*a*, 5*b*, 6*a*, 6*b* and 7 are wound around the common magnetic body 22 and the noises 12 and 13 transmitted over the lines 5*a*, 5*b*, 6*a*, 6*b* and 7 are canceled out each other with back electromotive forces generated in the lines 5*a*, 5*b*, 6*a*, 6*b* and 7. Thus, the noises 12 and 13 can be efficiently eliminated.

Since the number of turns of each of the lines 5*a*, 5*b*, 6*a*, 6*b* and 7 is set so as to make the influences exerted on the magnetic fields of the lines 5*a*, 5*b*, 6*a*, 6*b* and 7 uniform, at the time of efficiently eliminating the noises 12 and 13 by making the noises 12 and 13 transmitted over the lines 5*a*, 5*b*, 6*a*, 6*b* and 7 cancel out each other, the noises 12 and 13 can be prevented from canceling out excessively or insufficiently.

Although the number of turns of each of the three lines 6*a*, 6*b* and 7 of the indoor/outdoor lines Lin is set individually on the basis of the impedance of each of the lines in the foregoing embodiment, the number of turns of the indoor/outdoor lines Lin as a bundle of electric lines may be set in consideration of a total single impedance in a parallel circuit of the lines 6*a*, 6*b* and 7 of the indoor/outdoor lines Lin as a bundle of electric lines. In this case, the number of turns of each of the lines 6*a*, 6*b* and 7 of the indoor/outdoor lines Lin is the same.

While the invention has been shown and described in detail, the foregoing description is in all aspects illustrative and not restrictive. It is therefore understood that numerous modifications and variations can be devised without departing from the scope of the invention.

The invention claimed is:

1. A noise filter in an electric device for reducing noises from a predetermined noise generating source, said electric device comprising:

a first unit to which power is supplied from an original power source, said first unit having the predetermined noise generating source; and a second unit to which said power is supplied through a branch in said first unit, power source lines for supplying said power from said original power source to said predetermined noise generating source and inter-unit lines for supplying said power from said branch to said second unit being wound around the same magnetic body.

2. The noise filter according to claim 1, wherein the number of turns of said power source lines and that of said inter-unit lines are set to be different from each other.

3. The noise filter according to claim 2, wherein the ratio of the number of turns of said inter-unit lines to the number of turns of said power source lines is set on the basis of the ratio of an impedance of said inter-unit lines to an impedance of said power source lines.

4. The noise filter according to claim 2, wherein the ratio of the number of turns of said inter-unit lines to the number of turns of said power source lines is set to be almost equal to the ratio of an impedance of said inter-unit lines to an impedance of said power source lines.

5. The noise filter according to claim 3, wherein said inter-unit lines are constructed of a plurality of lines, a total impedance of the plurality of lines is regarded as an impedance of said inter-unit lines, and a bundle of electric lines obtained by bundling said plurality of lines is wound as said inter-unit lines.

6. The noise filter according to claim 2, wherein said inter-unit lines are constructed of a plurality of lines, and the ratio of the number of turns of said power source lines and the number of turns of said plurality of lines of said inter-unit lines is set on the basis of the ratio of respective impedances.

7. The noise filter according to claim 6, wherein the ratio between the number of turns of said power source lines and the number of turns of said plurality of lines of said inter-unit lines is set almost proportional to the ratio of said impedances.

8. An outdoor unit to which power is supplied from an original power source, comprising a predetermined noise generating source and a noise filter for reducing noises from said predetermined noise generating source, wherein the outdoor unit is provided for an air conditioner, together with an indoor unit to which said power is supplied through a branch in said outdoor unit, and in said noise filter, power source lines for supplying said power from said original power source to said predetermined noise generating source and inter-unit lines for supplying said power from said branch to said indoor unit are wound around the same magnetic body.

9. The outdoor unit according to claim 8, wherein said noise generating source is an inverter.

10. An air conditioner comprising:

an outdoor unit to which power is supplied from an original power source, having a predetermined noise generating source and a noise filter for reducing noises from said predetermined noise generating source; and an indoor unit to which said power is supplied through a branch in said outdoor unit, wherein in said noise filter, power source lines for supplying said power from said original power source to said predetermined noise generating source and inter-unit lines for supplying said power from said branch to said indoor unit are wound around the same magnetic body.

11. The outdoor unit according to claim 8, wherein the number of turns of said power source lines and that of said inter-unit lines are set to be different from each other.

12. The outdoor unit according to claim 11, wherein the ratio of the number of turns of said inter-unit lines to the number of turns of said power source lines is set on the basis of the ratio of an impedance of said inter-unit lines to an impedance of said power source lines.

13. The outdoor unit according to claim 11, wherein the ratio of the number of turns of said inter-unit lines to the number of turns of said power source lines is set to be almost equal to the ratio of an impedance of said inter-unit lines to an impedance of said power source lines.

14. The outdoor unit according to claim 12, wherein said inter-unit lines are constructed of a plurality of lines, a total impedance of the plurality of lines is regarded as an impedance of said inter-unit lines, and a bundle of electric lines obtained by bundling said plurality of lines is wound as said inter-unit lines.

15. The outdoor unit according to claim 11, wherein said inter-unit lines are constructed of a plurality of lines, and the ratio of the number of turns of said power source lines and the number of turns of said plurality of lines of said inter-unit lines is set on the basis of the ratio of respective impedances.

16. The outdoor unit according to claim 15, wherein the ratio between the number of turns of said power source lines and the number of turns of said plurality of lines of said inter-unit lines is set almost proportional to the ratio of said impedances.

* * * * *